(12) United States Patent
Yoshioka

(10) Patent No.: US 7,446,417 B2
(45) Date of Patent: Nov. 4, 2008

(54) SEMICONDUCTOR INTEGRATED CIRCUIT DEVICE AND FABRICATION METHOD THEREOF

(75) Inventor: Keiichi Yoshioka, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 185 days.

(21) Appl. No.: 10/633,681

(22) Filed: Aug. 5, 2003

(65) Prior Publication Data

US 2004/0031004 A1 Feb. 12, 2004

(30) Foreign Application Priority Data

Aug. 9, 2002 (JP) .............................. 2002-232551

(51) Int. Cl.
*H01L 29/72* (2006.01)
(52) U.S. Cl. ....................... 257/758; 257/368; 257/401; 257/691; 257/707; 257/712; 257/760; 257/773
(58) Field of Classification Search ................. 257/758, 257/368, 401, 691, 707, 712, 760, 773
See application file for complete search history.

(56) References Cited

U.S. PATENT DOCUMENTS

| | | | |
|---|---|---|---|
| 4,855,803 A | 8/1989 | Azumai et al. | |
| 4,922,441 A | 5/1990 | Tsukagoshi et al. | |
| 5,161,229 A | 11/1992 | Yasui et al. | |
| 5,301,338 A | 4/1994 | Yamaura et al. | |
| 5,511,173 A | 4/1996 | Yamaura et al. | |
| 5,594,890 A | 1/1997 | Yamaura et al. | |
| 5,596,761 A | 1/1997 | Yoshioka et al. | |
| 5,606,709 A | 2/1997 | Yoshioka et al. | |
| 5,630,158 A | 5/1997 | Hara et al. | |
| 5,696,957 A | 12/1997 | Yamaura et al. | |
| 5,896,515 A | 4/1999 | Aota et al. | |
| 5,938,758 A | 8/1999 | Katayama et al. | |
| 6,266,756 B1 | 7/2001 | Hara et al. | |
| 6,266,762 B1 | 7/2001 | Aota et al. | |
| 6,353,189 B1* | 3/2002 | Shimada et al. | .............. 174/255 |
| 6,519,750 B2 | 2/2003 | Yamashita | |
| 6,717,267 B1 | 4/2004 | Kunikiyo | |
| 6,919,235 B1* | 7/2005 | Yamazaki et al. | ............ 438/149 |
| 6,956,289 B2 | 10/2005 | Kunikiyo | |
| 2005/0023579 A1* | 2/2005 | Yamazaki | .................... 257/288 |

FOREIGN PATENT DOCUMENTS

| | | |
|---|---|---|
| JP | 10-199882 | 7/1998 |
| JP | 2798048 | 7/1998 |

(Continued)

*Primary Examiner*—Edward Wojciechowicz
(74) *Attorney, Agent, or Firm*—Dickstein Shapiro LLP

(57) ABSTRACT

A semiconductor integrated circuit device and a fabrication method thereof are disclosed, for effective suppression of a temperature increase therein that is caused by heat generation of a semiconductor element. The semiconductor integrated circuit device includes a semiconductor element, a multi-layer wiring structure and a heat conduction part. The semiconductor element is formed on a support substrate. The multi-layer wiring structure is formed in an insulation film on the support substrate and includes at least one connection hole and at least one metal wiring layer. The heat conduction part is formed of the same conductive materials as the connection hole and the metal wiring layer and extends toward an upper layer side along a path different from a wiring path including a connection hole and a metal wiring for signal transmission.

17 Claims, 12 Drawing Sheets

FOREIGN PATENT DOCUMENTS

| JP | 10-294371 | 11/1998 |
| --- | --- | --- |
| JP | 2971464 | 8/1999 |
| JP | 3128931 | 11/2000 |
| JP | 2001-196372 | 7/2001 |
| JP | 2001-257268 | 9/2001 |

\* cited by examiner

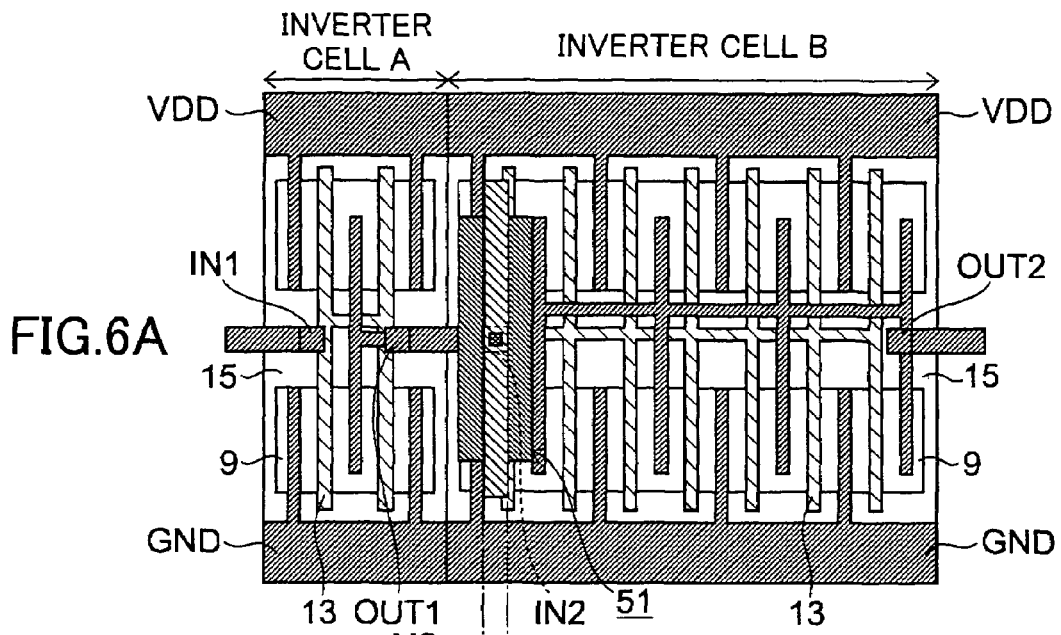
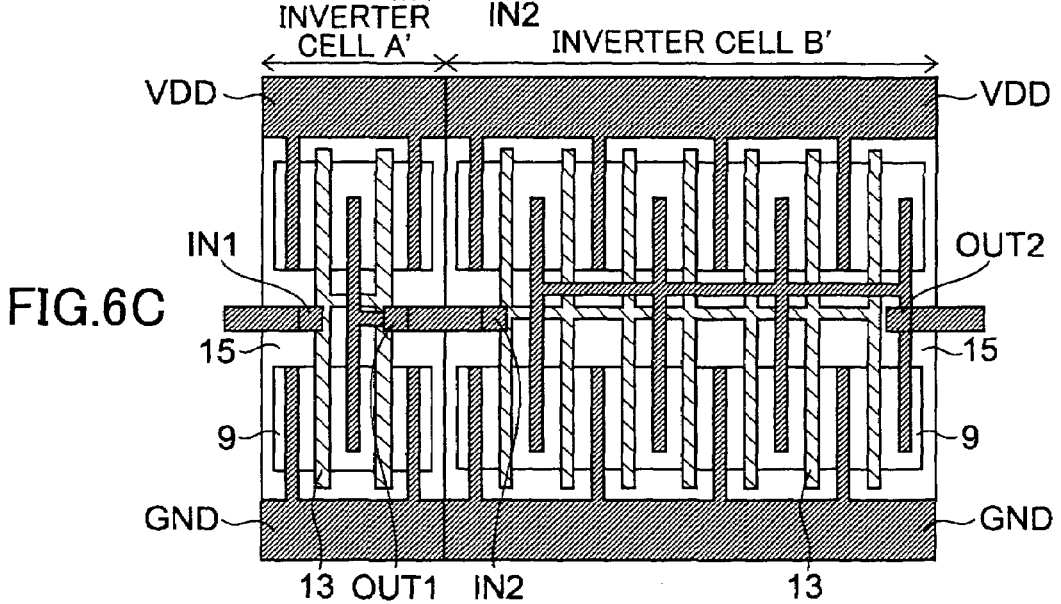
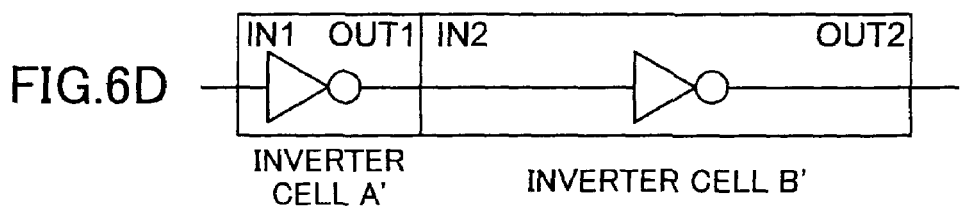

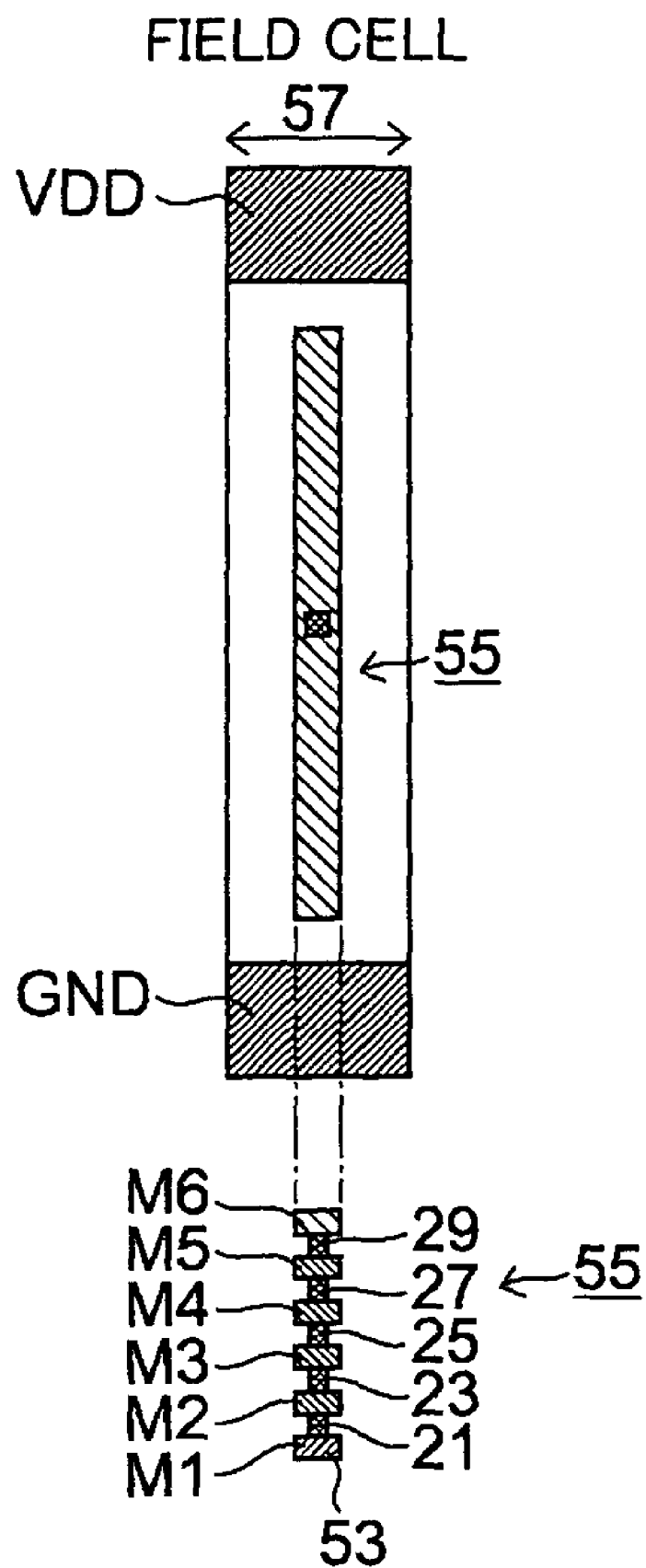

SEMICONDUCTOR INTEGRATED CIRCUIT DEVICE AND FABRICATION METHOD THEREOF

BACKGROUND OF THE INVENTION

1. Field of the Invention

The present invention generally relates to a semiconductor integrated circuit device and a fabrication method thereof, and more particularly to a semiconductor integrated circuit device that includes a semiconductor element formed on a support substrate comprising a semiconductor substrate or a silicon on insulator (SOI) substrate and a multi-layer wiring structure formed in an insulator film of the support substrate and a standard cell type fabrication method thereof that includes the steps of modularizing a circuit, which includes a plurality of semiconductor elements, for each function thereof, maintaining each function module as a standard cell in a library and arranging a plurality of standard cells.

2. Description of the Related Art

In a semiconductor integrated circuit device (which may be referred to as a chip hereinafter) that includes a MOS (Metal Oxide Semiconductor) transistor, factors such as chip miniaturization in a fabrication process, the increasing number of devices accommodated on the chip, and enhancement of the operational speed of the chip cause deterioration of the devices and the wiring on the chip, and performance degradation of the devices due to heat generation of the devices.

In general, a heat release mechanism of a package in an IC (Integrated Circuit) assembly is used to address the heat generation of a chip. According to the heat release mechanism, the heat is released by bringing the surface opposite to the semiconductor element surface, on which some devices are formed, of a silicon substrate (semiconductor substrate) into contact with the heat release mechanism.

In addition, the chip is designed to overcome the heat generation of the chip. For instance, the power consumption is reduced by dividing internal functions of the chip and activating a portion thereof so as to prevent the heat generation of the entire chip. Furthermore, a layout of the chip may be improved by adopting a standard cell type cell wiring arrangement. According to this method, each cell has a parameter for power consumption, and a power-consuming cell such as a clock driver, is distributed by using software means such as a cell wiring arrangement tool so as to distribute a heat generation area that causes heat locally on the chip.

Japanese Patent No. 2971464 discloses a method of arranging cells in a chip. In this method, a virtual temperature parameter is included in a standard cell library, and the cells are arranged through adjustment of the virtual temperature and a cost value.

Japanese Patent No. 2798048 discloses a method of adjusting a temperature distribution in a chip by disposing a cell, of which activation rate is higher, on the periphery of the chip.

Also, a MOS transistor having an SOI structure is used to address a problem regarding a MOS transistor channel capacity entailed in miniaturization in a fabrication process. There are three types of SOI structures. FIGS. 1A through 1D are cross-sectional views of a conventional MOS transistor and the three conventional types of a MOS transistor having the SOI structure.

Referring to FIG. 1A, the conventional MOS transistor includes two source regions or two drain regions 9, which are formed to have an interval, on the surface of a silicon substrate 1. Additionally, the conventional MOS transistor includes a gate electrode 13 between the source regions or the drain regions 9 on the silicon substrate 1 via a gate oxide film 11.

Referring to FIG. 1B, a fully-depletion type SOI-MOS transistor (hereinafter referred to as a fully-depletion type SOI transistor) is formed on an SOI substrate 7. The SOI substrate 7 includes a buried oxide film 3 formed on the silicon substrate 1 and a single crystal silicon layer 5 formed on the buried oxide film 3. Two source regions or two drain regions are formed at an interval on the single crystal silicon layer 5. A gate electrode 13 is formed between the two source regions or the two drain regions 9 on the single crystal silicon layer 5 via the gate oxide film 11. In the fully depletion type SOI transistor, the single crystal layer 5 under the channel region is fully depleted.

Referring to FIG. 1C, a partially-depletion type SOI-MOS transistor (hereinafter referred to as a partially-depletion type SOI transistor) is formed on the SOI substrate 7. Two source regions or two drain regions 9 are formed at an interval on the single crystal silicon layer 5. A gate electrode 13 is formed between the two source regions or the two drain regions 9 on the single crystal silicon layer 5 via the gate oxide film 11. The partially-depletion type SOI transistor includes the single crystal silicon layer 5 of a greater film thickness than the fully-depletion type SOI transistor. Also, the partially-depletion type SOI transistor has a non-depleted region at the bottom part of the single crystal silicon layer 5.

Referring to FIG. 1D, a SON (Silicon On Nothing)-MOS transistor (hereinafter referred to as a SON transistor) is formed on the silicon substrate 1 in which a vacancy or a buried oxide film 14 is formed beneath the channel region on the surface. Two source regions or two drain regions 9 are formed to sandwich the channel region above the vacancy or the buried oxide film 14 on the silicon substrate 1. A gate electrode 13 is formed between the two source regions or the two drain regions 9 on the single crystal silicon layer 5 via the gate oxide film 11.

In the SOI MOS transistor and the SON transistor, the channel layer is thin and it is difficult to conduct heat to the silicon substrate due to an insulator. Especially, the fully-depletion type SOI transistor has a self-heating problem due to heat generation of the gate electrode.

Japanese Patent No. 3128931 discloses a simulation method for a semiconductor device. In this simulation method, heat generation due to an SOI device is taken into account, and a temperature variation due to the self heating of the SOI device itself and the mobility due to the temperature variation are calculated. The operation of the SOI device is simulated by using the varied mobility.

The disclosed conventional methods are not intended to prevent a temperature increase of a semiconductor integrated circuit device due to heat generation of a semiconductor element.

SUMMARY OF THE INVENTION

It is a general object of the present invention to provide a semiconductor integrated circuit device and a fabrication method thereof in which one or more of the above-mentioned problems are eliminated.

A more specific object of the present invention is to provide a semiconductor integrated circuit device that can prevent or substantially reduce the likelihood of a temperature increase of the semiconductor integrated circuit device due to the heat generation of a semiconductor element and a fabrication method thereof.

In order to achieve the above-mentioned objects, there is provided according to one aspect of the present invention a semiconductor integrated circuit device, including: a semiconductor element being formed on a support substrate; a multi-layer wiring structure being formed in an insulation film on the support substrate, the multi-layer wiring structure comprising at least one connection hole and at least one metal wiring layer; and a heat conduction part being formed of the same conductive materials as the connection hole and the metal wiring layer, the heat conduction part extending toward an upper layer side along a path different from a wiring path comprising a connection hole and a metal wiring for signal transmission.

In an embodiment of the present invention, the support substrate may include one of a semiconductor substrate and a SOI substrate.

According to one aspect of the present invention, the heat conduction part is capable of releasing heat generated in a semiconductor element to the upper layer side of the semiconductor integrated circuit device. As a result, it is possible to prevent a temperature increase in the semiconductor integrated circuit device.

In an embodiment of the present invention, the heat conduction part may include an uppermost wiring layer.

According to one aspect of the present invention, the heat conduction part is capable of conducting heat generated in a semiconductor element to the vicinity of the upper layer surface. As a result, it is possible to improve efficiency of heat release.

In an embodiment of the present invention, the semiconductor integrated circuit device may further include an aperture on the uppermost wiring layer in the insulation film.

According to one aspect of the present invention, it is possible to release heat more efficiently.

In an embodiment of the present invention, the semiconductor element may include a MOS transistor and the MOS transistor may include one of a fully-depletion type SOI transistor, a partially-depletion type SOI transistor and a SON transistor.

According to one aspect of the present invention, when the semiconductor element includes, in particular, a fully-depletion type SOI transistor, it is possible to effectively overcome a self-heating problem due to heat generation of a gate electrode.

In an embodiment of the present invention, the heat conduction part may be connected to a gate electrode of the MOS transistor directly or via the connection hole and the metal wiring layer for signal transmission.

According to one aspect of the present invention, it is possible to release heat generated in a gate electrode of a MOS transistor through a heat conduction part.

In an embodiment of the present invention, the heat conduction part may be connected to one of a source region and a drain region of the MOS transistor directly or via the connection hole and the metal wiring layer for signal transmission.

According to one aspect of the present invention, it is possible to release heat generated in a gate electrode of a MOS transistor from a source region or a drain region through a heat conduction part.

In an embodiment of the present invention, the heat conduction part may be connected to an element separation film to electrically separate the MOS transistor directly or via the connection hole and the metal wiring layer for signal transmission.

According to one aspect of the present invention, it is possible to release heat generated in a gate electrode of a MOS transistor from an element separation film through a heat conduction part.

In an embodiment of the present invention, the heat conduction part may include at least one dummy metal that is not used as an electric wire, the dummy metal being disposed at the same coordinate for each layer of the multi-layer wiring structure and being connected to each other via a connection hole.

According to one aspect of the present invention, it is possible to conduct heat closed between wiring layers to the upper layer side and prevent a temperature increase of a semiconductor integrated circuit device more effectively.

Additionally, there is provided according to another aspect of the present invention a semiconductor integrated circuit device, including: a plurality of semiconductor elements being formed on a support substrate; a plurality of function modules being formed by modularizing the plurality of semiconductor elements for each function thereof; and at least one heat conduction part including the same conductive materials as a connection hole and a metal wiring layer constituting a multi-layer wiring structure, the heat conduction part extending toward an upper layer side along a path different from a wiring path including a connection hole and a metal wiring layer for signal transmission, wherein at least one of the plurality of function modules includes one or more of the at least one heat conduction part.

According to one aspect of the present invention, since a heat generation part can be disposed above a semiconductor element being an heat source, it is possible to obtain greater efficiency of heat release.

In an embodiment of the present invention, the heat conduction part may be arranged corresponding to heat capacity of a gate electrode of each of the plurality of function modules.

According to one aspect of the present invention, a heat conduction part can be selectively provided to a function module in which a high activation rate is estimated. As a result, it is possible to minimize a roundabout of a signal line for a heat generation part.

In an embodiment of the present invention, the semiconductor integrated circuit device may further include: at least one field cell being disposed in an empty space between the function modules, and wherein one or more of the at least one field cell may include one or more of the at least one heat conduction part.

According to one aspect of the present invention, it is possible to effectively release heat through a heat generation part without modification of a conventional function module.

In an embodiment of the present invention, the field cell having the heat conduction part may be disposed corresponding to heat capacity of a gate electrode in a function module.

According to one aspect of the present invention, a heat conduction part can be selectively provided to a function module in which a high activation rate is estimated. As a result, it is possible to minimize a roundabout of a signal line for a heat generation part.

Additionally, there is provided according to another aspect of the present invention a method of fabricating a standard cell type semiconductor integrated circuit device having a plurality of semiconductor elements, the method including the steps of: modularizing the plurality of semiconductor elements for each function thereof so as to form a plurality of function modules; maintaining the plurality of function modules as standard cells in a library; and arranging the standard cells in the standard cell type semiconductor integrated circuit device, wherein at least one of the standard cells includes a heat conduction part, the heat conduction part including the same conductive materials as a connection hole and a metal wiring layer constituting a multi-layer wiring structure, the heat conduction part extending toward an upper layer side along a path different from a wiring path including a connection hole and a metal wiring layer for signal transmission.

According to one aspect of the present invention, it is possible to effectively prevent or at least reduce the likelihood of a temperature increase of a semiconductor integrated circuit device due to heat generation of a semiconductor element. In addition, it is possible to perform a replacement process for replacing a conventional standard cell with a standard cell having a heat conduction part after a determination process of a detailed wiring layout of a fabrication method of a semiconductor integrated circuit device.

In an embodiment of the present invention, the standard cell type semiconductor integrated circuit device may include at least one field cell being arranged in an empty space between the function modules, and wherein the field cell may include a heat conduction part comprising the same conductive materials as a connection hole and a metal wiring layer constituting a multi-layer wiring structure, the heat conduction part extending toward an upper layer side along a path different from a wiring path comprising a connection hole and a metal wiring layer for signal transmission.

According to one aspect of the present invention, a heat conduction part of a field cell can prevent or at least reduce the likelihood of a temperature increase, which is caused by heat generation of a semiconductor element, of a semiconductor integrated circuit device. In addition, it is possible to perform a replacement process for replacing a conventional standard cell with a field cell having a heat conduction part after a determination process of a detailed wiring layout of a fabrication method of a semiconductor integrated circuit device.

Other objects, features and advantages of the present invention will become more apparent from the following detailed description when read in conjunction with the accompanying drawings.

BRIEF DESCRIPTION OF THE DRAWINGS

FIGS. 6A and 6B are diagrams illustrating standard cells of a standard cell type semiconductor integrated circuit device according to one embodiment of the present invention;

FIGS. 6C and 6D are diagrams illustrating conventional standard cells;

FIGS. 7A and 7B are diagrams illustrating a field cell having a heat conduction part according to one embodiment of the present invention;

DETAILED DESCRIPTION OF THE PREFERRED EMBODIMENTS

In the following, embodiments of the present invention will be described with reference to the accompanying drawings.

Figure 1A:
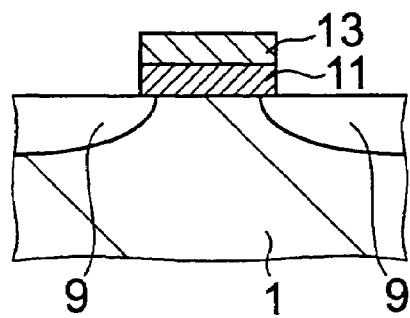
FIGS. 1A through 1D are cross-sectional views of a conventional MOS transistor and three types of conventional SOI transistors.
Figure 1B:
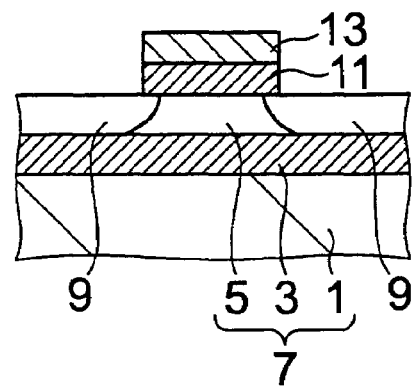
Figure 1C:
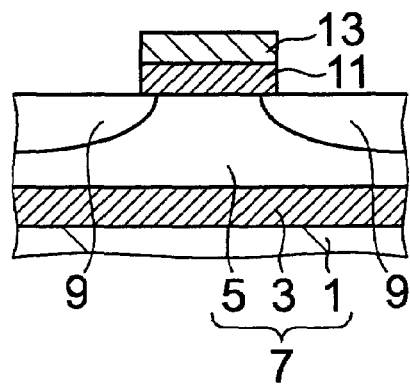
Figure 1D:
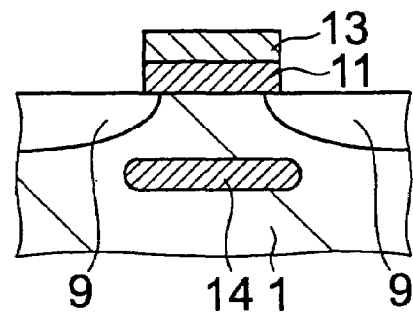
Figure 2:
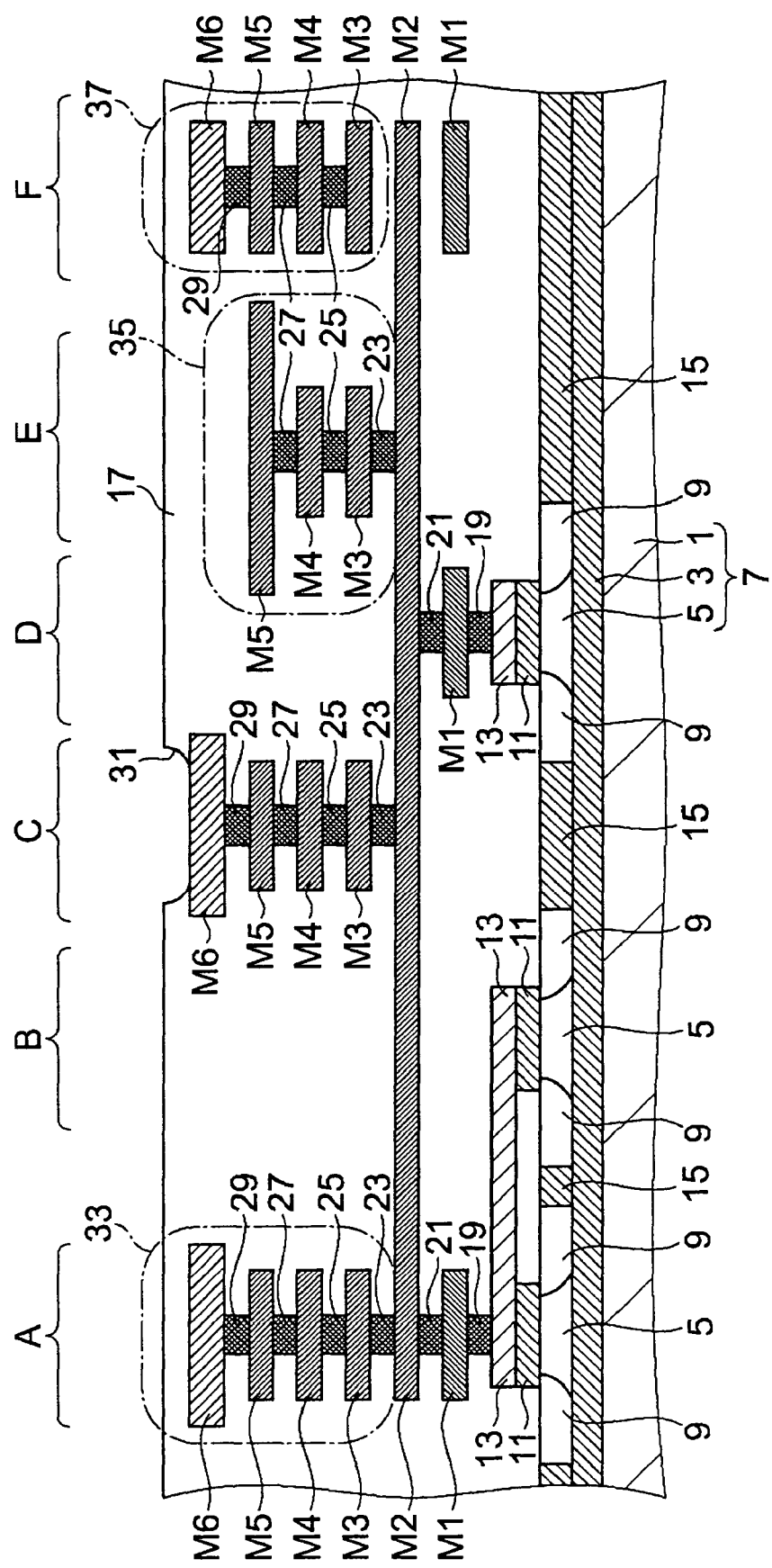
FIG. 2 is a cross-sectional view of a semiconductor integrated circuit device according to one embodiment of the present invention.

FIG. 2 is a cross-sectional view of a semiconductor integrated circuit device according to one embodiment of the present invention. The semiconductor integrated circuit device includes a semiconductor element such as a fully-depletion type SOI transistor. The semiconductor integrated circuit device comprises a six-layer metal wiring structure. In FIG. 2, individual metal wiring layers are illustrated to have certain sizes, for example, as shown in widths thereof. However, it will be understood that the semiconductor integrated circuit device according to the present invention is not limited to this illustration.

A buried oxide film 3 is formed on a SOI substrate 1, and a plurality of fully-depletion type SOI transistors are formed on a single crystal silicon layer 5 on the buried oxide film 3. Each of the fully-depletion type MOS transistors are electrically separated by separation oxide films 15. The separation oxide films 15 are formed, for example, in accordance with a STI (Shallow Trench Isolation) technique for separating a semiconductor element from another semiconductor element. In accordance with the STI technique, an insulator is buried in shallow trenches for the separation. The fully-depletion type MOS transistor comprises two source regions or two drain regions 9 and a gate electrode 13. The source regions or the drain regions 9 are formed at an interval on the single crystal silicon layer 5 of the SOI substrate 1. The gate electrode 13 is formed of a polysilicon film, for example, between the source regions or the drain regions 9 on the single crystal silicon layer 5 via a gate oxide film 11. Two fully-depletion type SOI transistors in the regions A and B have a common gate electrode 13.

An insulation layer 17 is formed by layering a plurality of insulation layers on the fully-depletion type SOI transistors and the SOI substrate 1 including the element separation film 15. From the bottom layer, metal wiring layers M1, M2, M3, M4, M5 and M6 are sequentially formed in the insulation layer 17.

In the regions A and D, in which the fully-depletion type SOI transistors are formed, the gate electrode 13 is electrically connected to the metal wiring layer M1, which is the bottom layer, via a contact layer 19 and then is electrically connected to the metal wiring layer M2 via a via layer 21.

In the region C, the metal wiring layer M2 is electrically connected to the metal wiring layer M6, which is the top layer, via a via layer 23, the metal wiring layer M3, a via layer 25, the metal wiring layer M4, a via layer 27, the metal wiring layer M5 and a via layer 29. A pad aperture 31 is formed in the insulation layer 17 just above the metal wiring layer M6. Hence, connection holes and metal wiring layers to transmit a signal comprise the components in the wiring path between the contact layer 19 in the region A and the metal wiring layer M6 in the region C.

In the region A, in which the fully-depletion type SOI transistor is formed, a heat conduction part 33 is provided. The heat conduction part 33 comprises a via layer 23, a metal wiring layer M3, a via layer 25, a metal wiring layer M4, a via layer 27, a metal wiring layer M5, a via layer 29 and a metal wiring layer M6. The heat conduction part 33 is formed on the metal wiring layer M2 in a path different from signal transmission path provided by the above-mentioned connection holes and metal wiring layers.

When heat is generated in the region A by the gate operation of the fully-depletion type SOI transistor, the heat is conducted to the contact layer 19, the metal wiring layer M1, the via layer 21 and the metal wiring layer M2 sequentially. Then, the heat is conducted to the metal wiring layer M6 in the region A via the heat conduction part 33 and is released from the upper surface of the insulation layer 17. Thereby, it is possible to prevent a temperature increase of the semiconductor integrated circuit device.

In this embodiment, the heat conduction part 33 comprises the metal wiring layers M3, M4, M5 and M6 and the via layers 23, 25, 27 and 29 in the region A. Also, the heat conduction part 33 is connected to the gate electrode 13 via the components for signal transmission: the contact layer 19, the metal wiring layer M1, the via layer 21 and the metal wiring layer M2. However, the heat conduction part 33 according to the present invention is not limited to this configuration. For instance, neither of conductive components in the region A between the contact layer 19 and the metal wiring layer M6 may be connected to the metal wiring layers for signal transmission and the heat conduction part 33 may be connected to the gate electrode 13 directly.

In the region E adjacent to the region D where a fully-depletion type SOI transistor is formed, a heat conduction part 35 is formed. The heat conduction part 35 comprises a via layer 23, a metal wiring layer M3, a via layer 25, a metal wiring layer M4, a via layer 27 and a metal wiring layer M5. The heat conduction part 35 is formed on the metal wiring layer M2 in a path different from the connection holes and the metal wiring layers for signal transmission.

When heat is generated in the regions D and E by the gate operation of the fully-depletion type SOI transistor, the heat is conducted to a contact layer 19, a metal wiring layer M1, a via layer 21, the metal wiring layer M2 in the region D. Then, the heat is conducted to the metal wiring layer M5 via the heat conduction part 35 and is released from the upper surface of the insulation layer 17. As seen in this embodiment, a heat conduction part according to the present invention need not necessarily contain the metal wiring layer M6. Also, the heat conduction part may be formed in the region E different from the gate electrode 13 in the region D of the fully-depletion type SOI transistor.

The metal wiring layers M3, M4, M5 and M6, which constitute the heat conduction parts 33 and 35, may be dummy metals that are not used as electric wires. Alternatively, the metal wiring layers M3, M4, M5 and M6 may be metal wiring layers dedicated to form the heat conduction part 33.

In the region F, a heat conduction part 37 is formed. The heat conduction part 37 comprises a metal wiring layer M3, a via layer 25, a metal wiring layer M4, a via layer 27, a metal wiring layer M5, a via layer 29 and a metal wiring layer M6. The heat conduction part 37 is not connected to the metal wiring layer M2, which serves as the metal wiring layer for signal transmission. In this embodiment, the metal wiring layers M3, M4, M5 and M6 are formed of dummy metals.

Figure 3A:
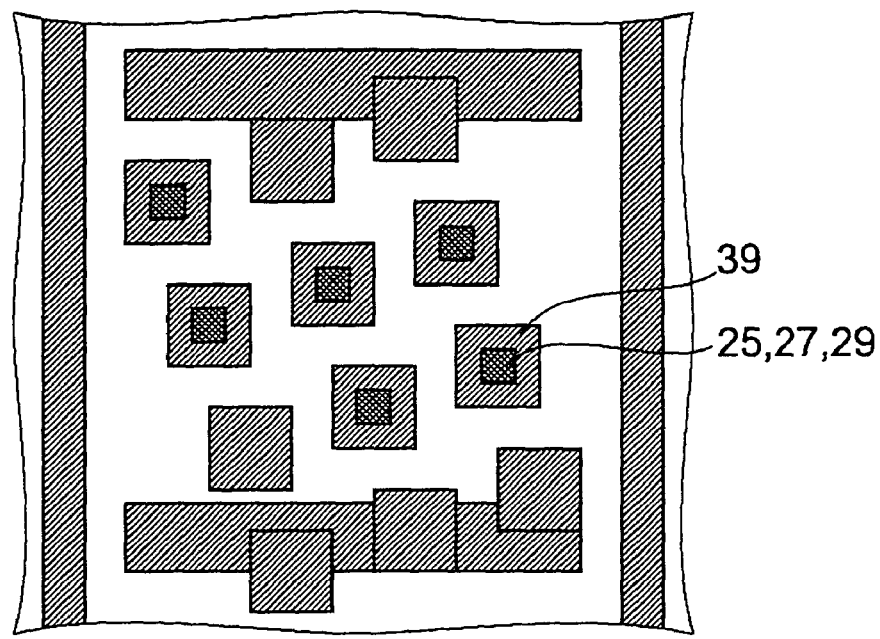
FIGS. 3A and 3B are plan views of regions where dummy metals are formed.
Figure 3B:
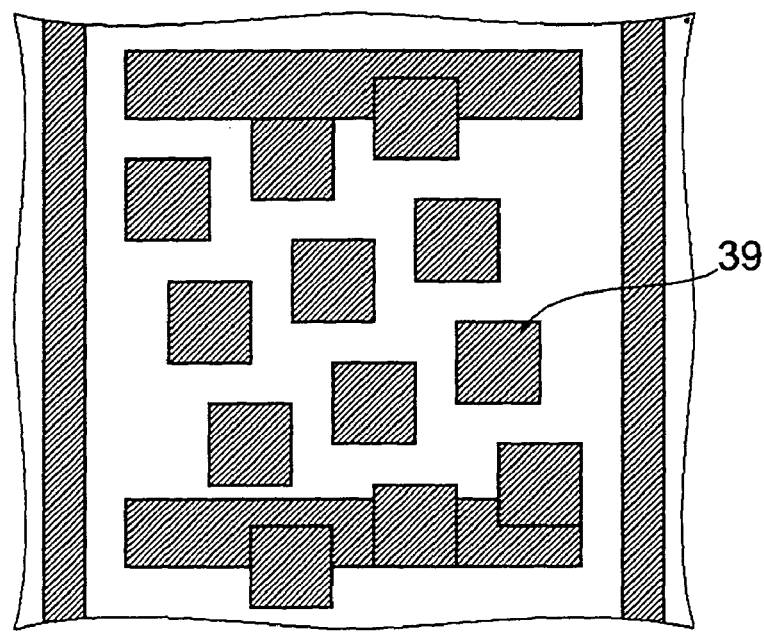

FIGS. 3A and 3B are plan views of a region where dummy metals are formed. FIG. 3A shows dummy metals that constitute a heat conduction part, and FIG. 3B shows dummy metals that do not constitute a heat conduction part.

Referring to FIG. 3B, for example, a dummy metal 39 is formed at the same coordinate from the top viewpoint of a semiconductor integrated circuit device for each of the metal wiring layers M3 through M6.

Referring to FIG. 3A and the region F in FIG. 2, when the dummy metals 39 are used as the heat conduction part, the individual metal wiring layers M3 through M6 are connected to each other via the via layers 25, 27 and 29. In this configuration, it is possible to conduct heat between the metal wiring layers to the upper layer side and further prevent a temperature increase of the semiconductor integrated circuit device.

Figure 4:
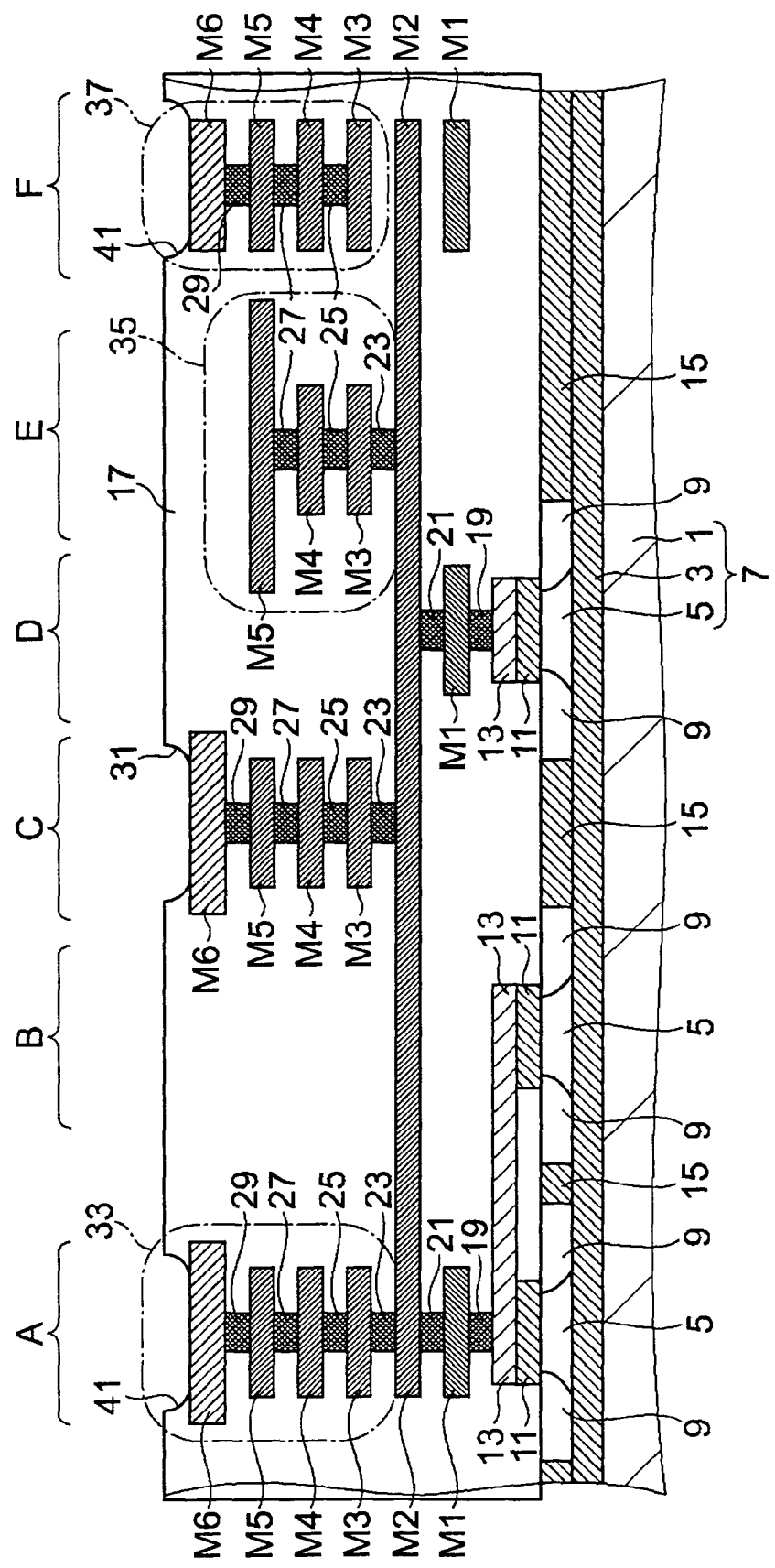
FIG. 4 is a cross-sectional view of a semiconductor integrated circuit device according to another embodiment of the present invention.

FIG. 4 is a cross-sectional view of a semiconductor integrated circuit device according to another embodiment of the present invention wherein the same parts as those in FIG. 2 are designated by the same reference numerals and the description thereof is omitted.

The semiconductor integrated circuit device according to this embodiment differs from the above-mentioned semiconductor integrated circuit device in FIG. 2 in that a heat release aperture 41 is formed in the insulation layer 17 on the metal wiring layer M6 in each of the regions A and F. It is preferable that the heat release apertures 41 be formed simultaneously with a pad aperture 31 so as to prevent an increase in the number of fabrication steps.

When the heat release apertures 41 are provided on the metal wiring layers M6, which constitute the heat conduction parts 33 and 35, it is possible to improve efficiency of heat release. In addition, if a semiconductor integrated circuit device, such as a BGA (Ball Grid Array) or a CSP (Chip Size Package), includes an external connection terminal, such as a solder ball, on a pad electrode (the metal wiring layer M6 in the pad aperture 31), the semiconductor integrated circuit device is configured to have additional external connection terminals on the metal wiring layers M6 in the heat release apertures 41. In this configuration, it is possible to increase the number of contact areas between the heat conduction parts including the external connection terminals and the exterior of the semiconductor integrated circuit device. As a result, it is possible to further improve the efficiency of heat release.

Figure 5:
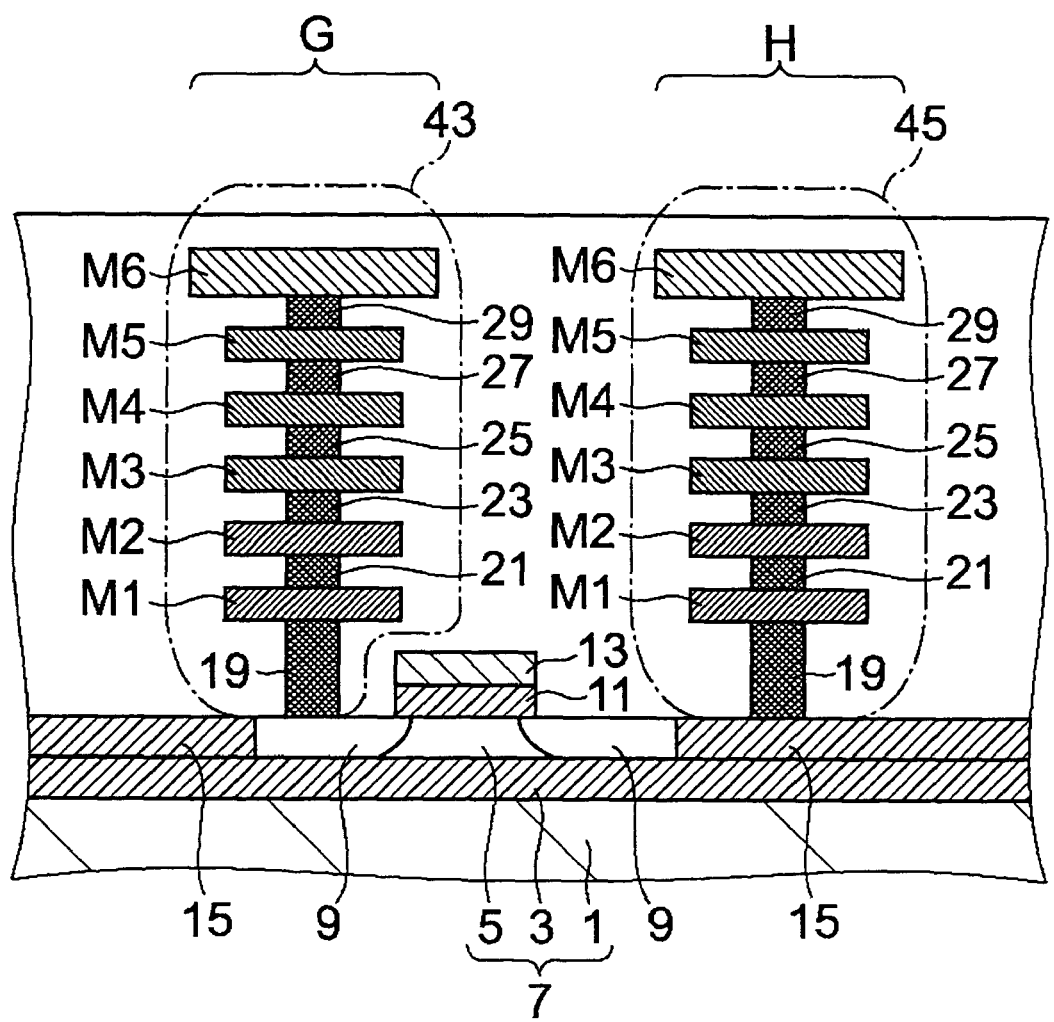
FIG. 5 is a cross-sectional view of a semiconductor integrated circuit device according to another embodiment of the present invention.

FIG. 5 is a cross-sectional view of a semiconductor integrated circuit device according to another embodiment of the present invention wherein the same parts as those in FIG. 2 and FIG. 4 are designated by the same reference numerals and the description thereof is omitted.

In the region G, in which the fully-depletion type SOI transistor is formed, a heat conduction part 43 is formed on the source region or the drain region 9. The heat conduction part 43 comprises a contact layer 19, a metal wiring layer M1, a via layer 21, a metal wiring layer M2, a via layer 23, a metal wiring layer M3, a via layer 25, a metal wiring layer M4, a via layer 27, a metal wiring layer M5, a via layer 29 and a metal wiring layer M6. In this configuration, it is possible to release heat generated in the gate electrode 13 from the source region or the drain region 9 via the heat conduction part 43.

In the region H adjacent to the region G, a heat conduction part 45 is formed on an element separation film 15. The heat conduction part 45 comprises a contact layer 19, a metal wiring layer M1, a via layer 21, a metal wiring layer M2, a via layer 23, a metal wiring layer M3, a via layer 25, a metal wiring layer M4, a via layer 27, a metal wiring layer M5, a via layer 29 and a metal wiring layer M6. In this configuration, it is also possible to release heat generated in the gate electrode 13 from the element separation film 15 via the heat conduction part 45.

In this embodiment, the semiconductor integrated circuit device includes the fully-depletion type SOI transistor as a semiconductor element. The semiconductor integrated circuit device according to the present invention is not limited to this embodiment. The semiconductor integrated circuit device may include another type of a semiconductor element: for example, a partially-depletion type SOI transistor, a SON transistor, a conventional MOS transistor, a capacitor and a resistor.

FIGS. 6A through 6D show standard cells of a standard cell type semiconductor integrated circuit device according to one embodiment of the present invention. FIG. 6A is a plan view of the standard cells. FIG. 6B is a cross-sectional view of a heat conduction part in FIG. 6A. FIG. 6C is a plan view of conventional standard cells. FIG. 6D is a circuit diagram of the conventional standard cells. Here, two inverter cells are used as the standard cells (function modules).

First, conventional standard cells A' and B' are described with reference to FIGS. 6C and 6D. In inverter cells A' and B', the source regions or the drain regions 9 are formed in activation regions enclosed by element separation films 15 on the semiconductor substrate, and gate electrodes 13 are formed of polysilicon films between the source regions or the drain regions 9 on the semiconductor substrate via gate oxide films (not illustrated). In each of the inverter cells A' and B', the gate electrode 13 is shared amongst a plurality of MOS transistors.

A power supply line VDD and a ground line GND are configured from a metal wiring layer M1, which is the bottom layer, on the semiconductor substrate via an insulation layer. The power supply line VDD and the ground line GND partially extend to the source regions or the drain regions 9 and are connected thereto via a contact layer (not illustrated).

In addition, an input line and an output line are configured from a metal wiring layer M1. An input line IN1 of the inverter cell A' is connected to the gate electrode 13 of the inverter cell A' via a contact layer (not illustrated), and an output line OUT1 of the inverter cell A' is connected to the source region or the drain region 9 different from that connected to the power supply line VDD or the ground line GND via the contact layer (not illustrated). An input line IN2 of the inverter cell B' is connected to the gate electrode 13 of the inverter cell B' via a contact layer (not illustrated), and an output line OUT2 of the inverter cell B' is connected to a source region or a drain region 9 different from the source region or the drain region 9 connected to the power supply line VDD or the ground line GND via a contact layer (not illustrated). The output line OUT1 of the inverter cell A' is connected to the input line IN2 of the inverter cell B'.

Standard cells A and B according to the present invention are described with reference to FIGS. 6A and 6B. In this embodiment, the inverter cell A has the same configuration as the inverter cell A' in FIG. 6C. The inverter cell B further comprises a heat conduction part 51 connected to the input line IN2 in addition to the configuration of the inverter cell B'. The heat conduction part 51 comprises via layers 21, 23, 25, 27 and 29 and metal wiring layers M2, M3, M4, M5 and M6 (FIG. 6B).

As mentioned above, when the heat conduction part 51 is connected to the input line IN2 connected to the gate electrode 13, in which heat is generated, of the inverter cell B, it is possible to realize a standard cell type semiconductor integrated circuit device that can release the heat through the heat conduction part.

The above-mentioned standard cell type semiconductor integrated circuit device includes a single heat conduction part 51. However, the standard cell type semiconductor integrated circuit device according to the present invention is not limited to this configuration. The standard cell type semiconductor integrated circuit device may include a plurality of heat conduction parts in one standard cell. Also, the heat conduction part according to the present invention is not limited to a signal line connected to a gate electrode. The heat conduction part may be connected to a gate electrode directly. Alternatively, the heat conduction part may be connected to a source region or a drain region directly or via a connection hole and a metal wiring layer for signal transmission. Alternatively, the heat conduction part may be connected to an element separation film directly.

FIGS. 7A and 7B show a field cell of a standard cell type semiconductor integrated circuit device according to another embodiment of the present invention. FIG. 7A is a plan view of the field cell, and FIG. 7B is a cross-sectional view of a heat conduction part.

A power supply line VDD, a ground line GND and a signal line 53 are configured from a metal wiring layer M1, which is the bottom layer, on an element separation film 15 (not illustrated) of a field cell 57, for example, of a minimum wiring grid. The field cell 57 comprises a heat conduction part 55 connected to the signal line 53. The heat conduction part 55 comprises via layers 21, 23, 25, 27 and 29 and metal wiring layers M2, M3, M4, M5 and M6.

Figure 8:
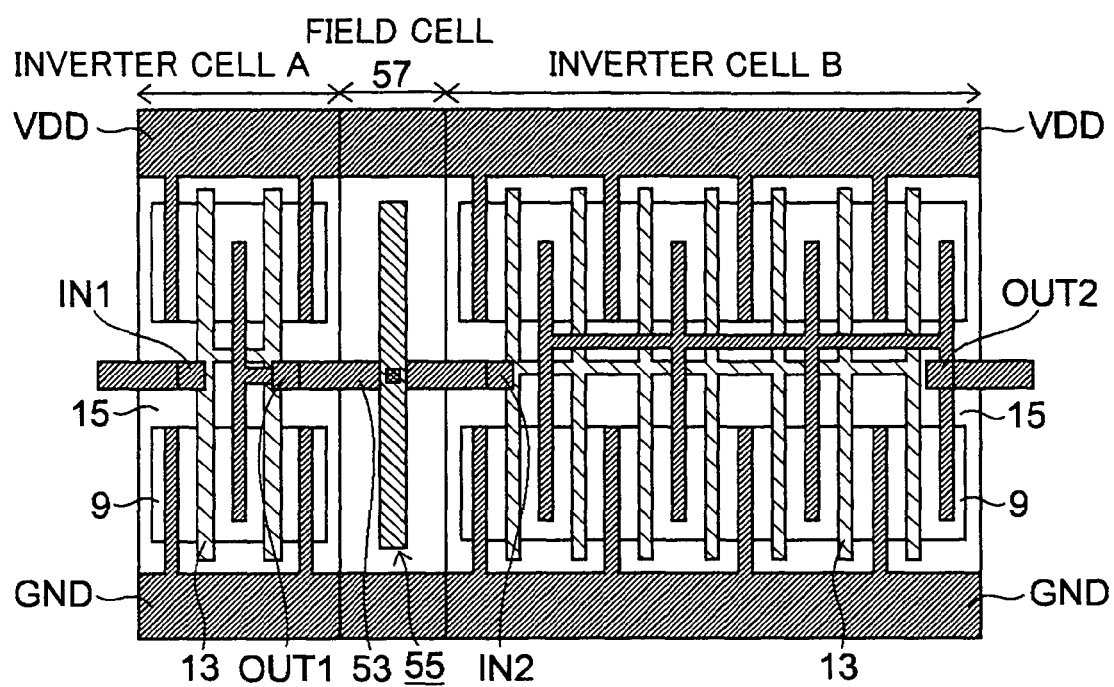
FIG. 8 is a diagram illustrating an exemplary arrangement of the field cell in FIGS. 7A and 7B.

FIG. 8 is a plan view of an exemplary arrangement of the field cell 57 in FIG. 7A. In this arrangement, the inverter cells A' and B' in FIG. 6C are used as the standard cells. The field cell 57 is arranged between the inverter cells A' and B'. The output line OUT1 of the inverter cell A' is connected to the input line IN2 of the inverter cell B' via the signal line 53.

When heat is generated in the gate electrode 13 of the inverter cell B', the heat is conducted to a heat conduction part 55 via the input line IN2 and the signal wire 53 and then released from the upper surface side of the semiconductor integrated circuit device. Since the heat conduction part 55 of the semiconductor integrated circuit device is provided in the field cell 57, it is possible to prevent a temperature increase of the semiconductor integrated circuit device. In addition, if the heat conduction part 55 is arranged in the field cell 57, it is possible to realize a standard cell type semiconductor integrated circuit device that can release heat through the heat conduction part 55 without modification of the conventional standard cells A' and B'.

Figure 9:
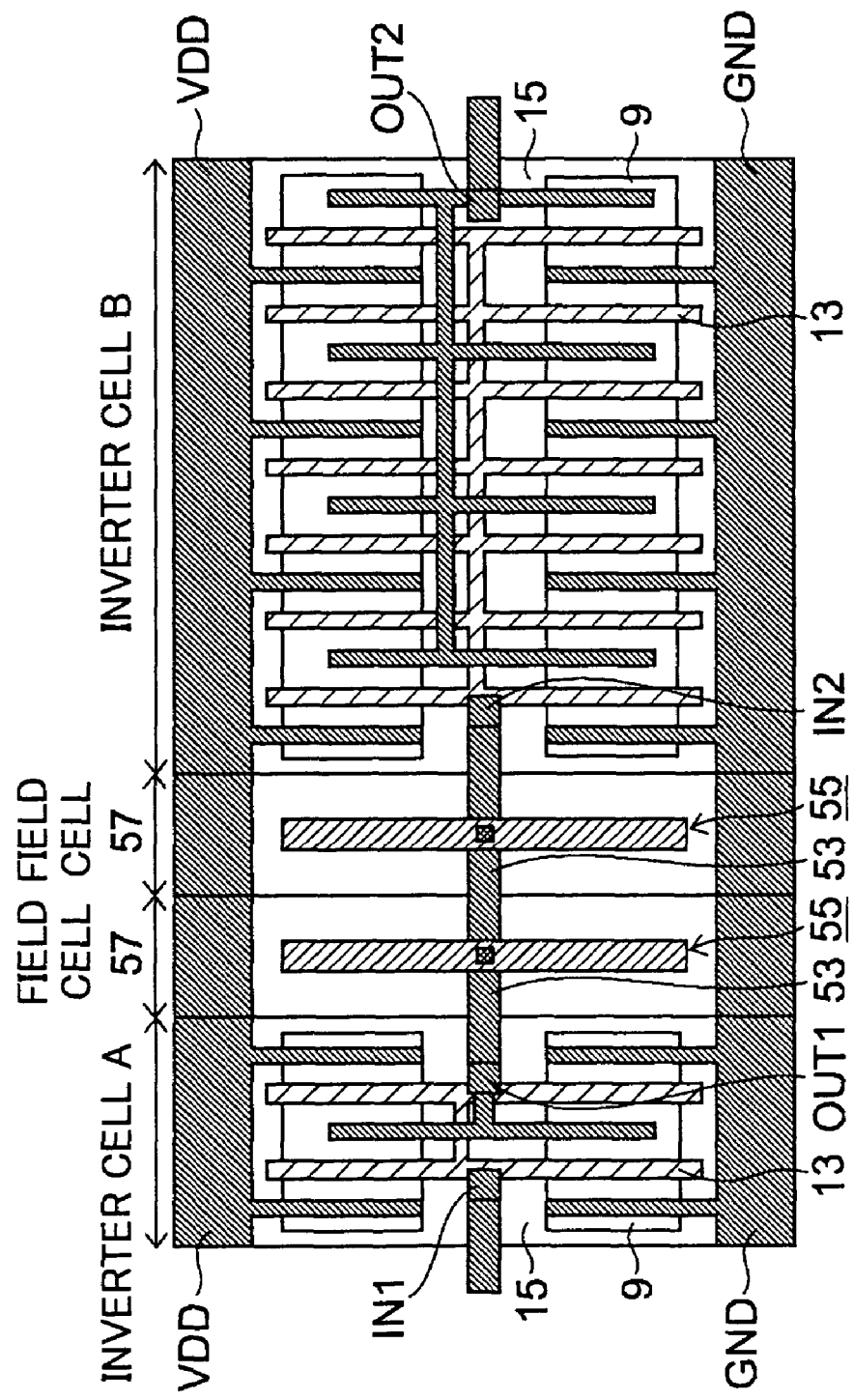
FIG. 9 is a diagram illustrating another exemplary arrangement of the field cell in FIGS. 7A and 7B.

In FIG. 8, a single field cell 57 is arranged between the inverter cells A' and B'. However, two field cells 57 may be arranged between the inverter cells A' and B', as illustrated in FIG. 9. Furthermore, any desirable number of field cells 57 may be arranged between prepared standard cells.

FIGS. 10A and 10B show another exemplary field cell. FIG. 10A is a plan view of the field cell, and FIG. 10B is a cross-sectional view of a heat conduction part. As shown in FIG. 10B, the heat conduction part may have greater sizes of metal wiring layers M4 and M5, which are upper layer sides, than metal wiring layers M3 and M2 so as to improve efficiency of heat release.

Figure 11:
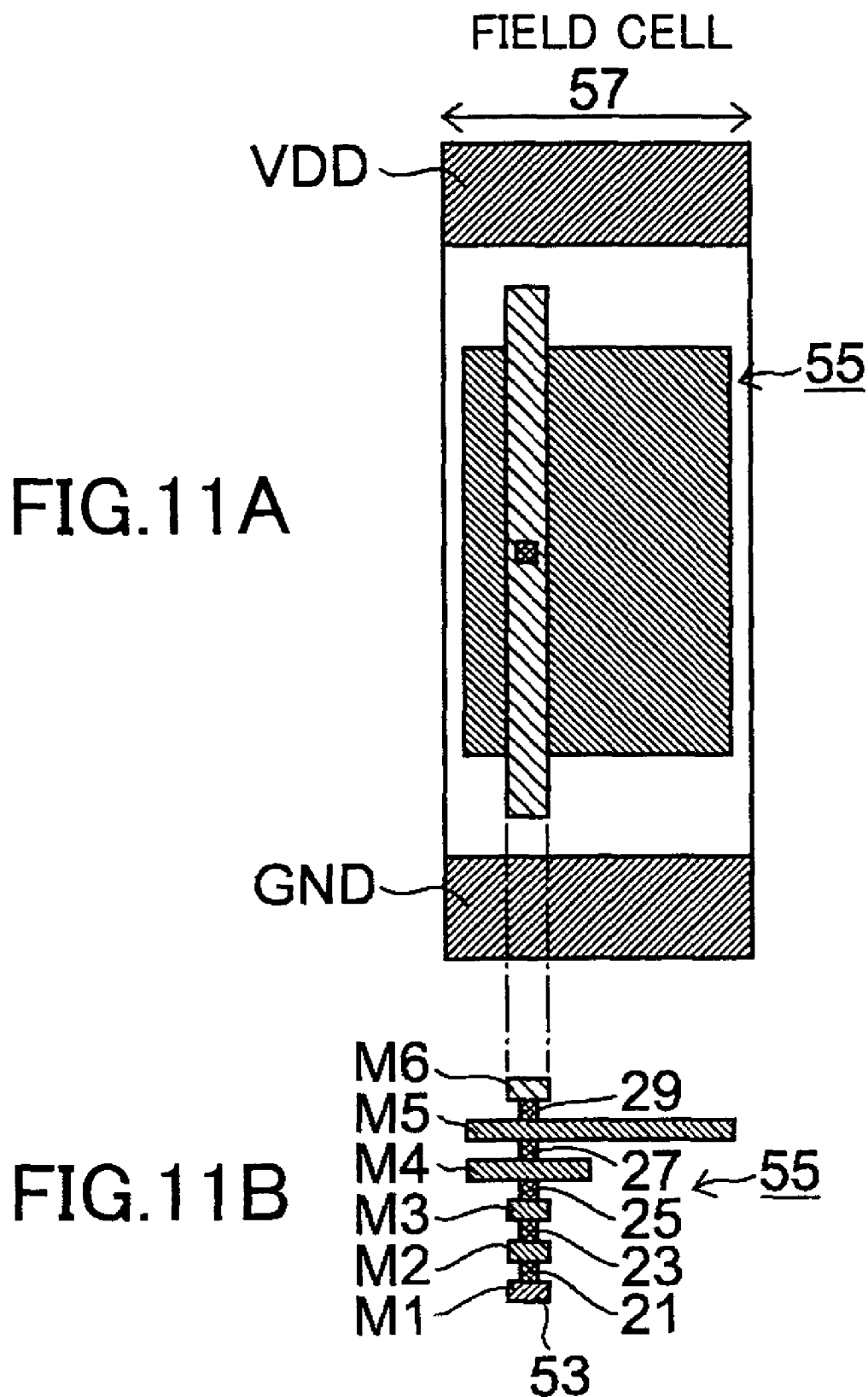
FIGS. 11A and 11B are diagrams illustrating a field cell having a heat conduction part according to another embodiment of the present invention.

Also, the size of a field cell is not limited to the minimum wiring grid. A field cell may have any suitable grid width, for example, as illustrated in FIG. 11A.

Also, the metal wiring layers M2 through M6 which constitute a heat conduction part may be od any suitable size.

In the above-mentioned embodiments in FIG. 6 through FIG. 11, the semiconductor integrated circuit device according to the present invention is applied to the standard cell type semiconductor integrated circuit device. However, the semiconductor integrated circuit device according to the present invention is not limited to these embodiments. The semiconductor integrated circuit device may be applied to another type of a semiconductor integrated circuit device and a fabrication method thereof. A semiconductor integrated circuit device, such as a gate array type semiconductor integrated circuit device, may be configured by modularizing a plurality of semiconductor elements for each function and arranging the function modules. Furthermore, the semiconductor integrated circuit device according to the present invention is applicable to another type semiconductor integrated circuit device other than the above-mentioned type semiconductor integrated circuit devices (a standard cell type semiconductor integrated circuit device and a gate array type semiconductor integrated circuit device).

Figure 12:
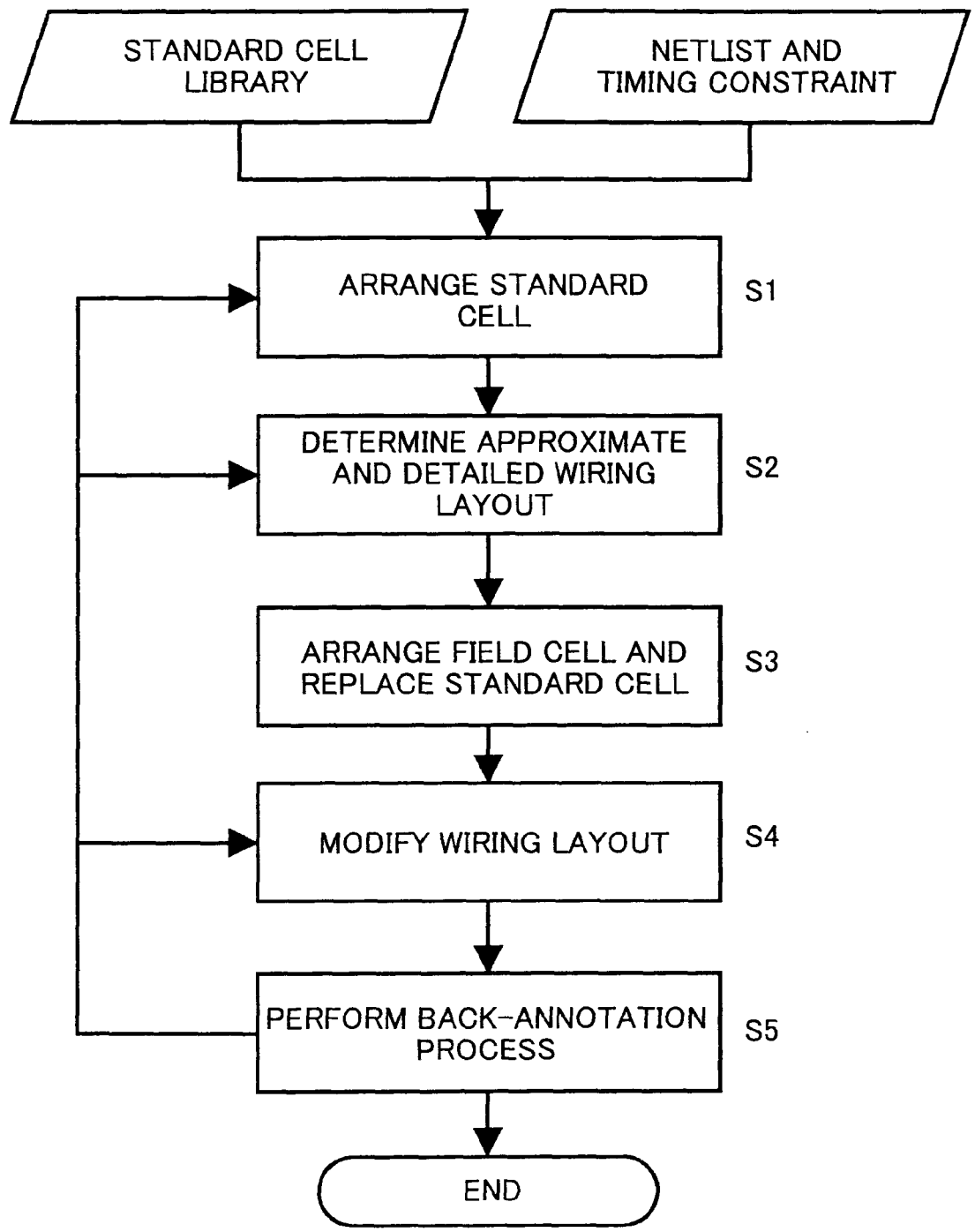
FIG. 12 is a flowchart of a method of fabricating a standard cell type semiconductor integrated circuit device according to one embodiment of the present invention.

FIG. 12 is a flowchart of a fabrication method of a standard cell type semiconductor integrated circuit device according to the present invention. Referring to FIG. 12, each standard cell is disposed on a chip based on a standard cell library, a netlist, timing constraints and other information at step S1.

At step S2, a wiring layout is approximately determined by dividing a wiring area into rectangular areas (channels) such that each of the rectangular areas does not overlap other areas and determining which channel a wiring path of each net (a set of terminals to be connected to each other at the same potential) passes through. Then, the wiring layout is determined in detail by determining a detailed wiring path in each channel.

Figure 10:
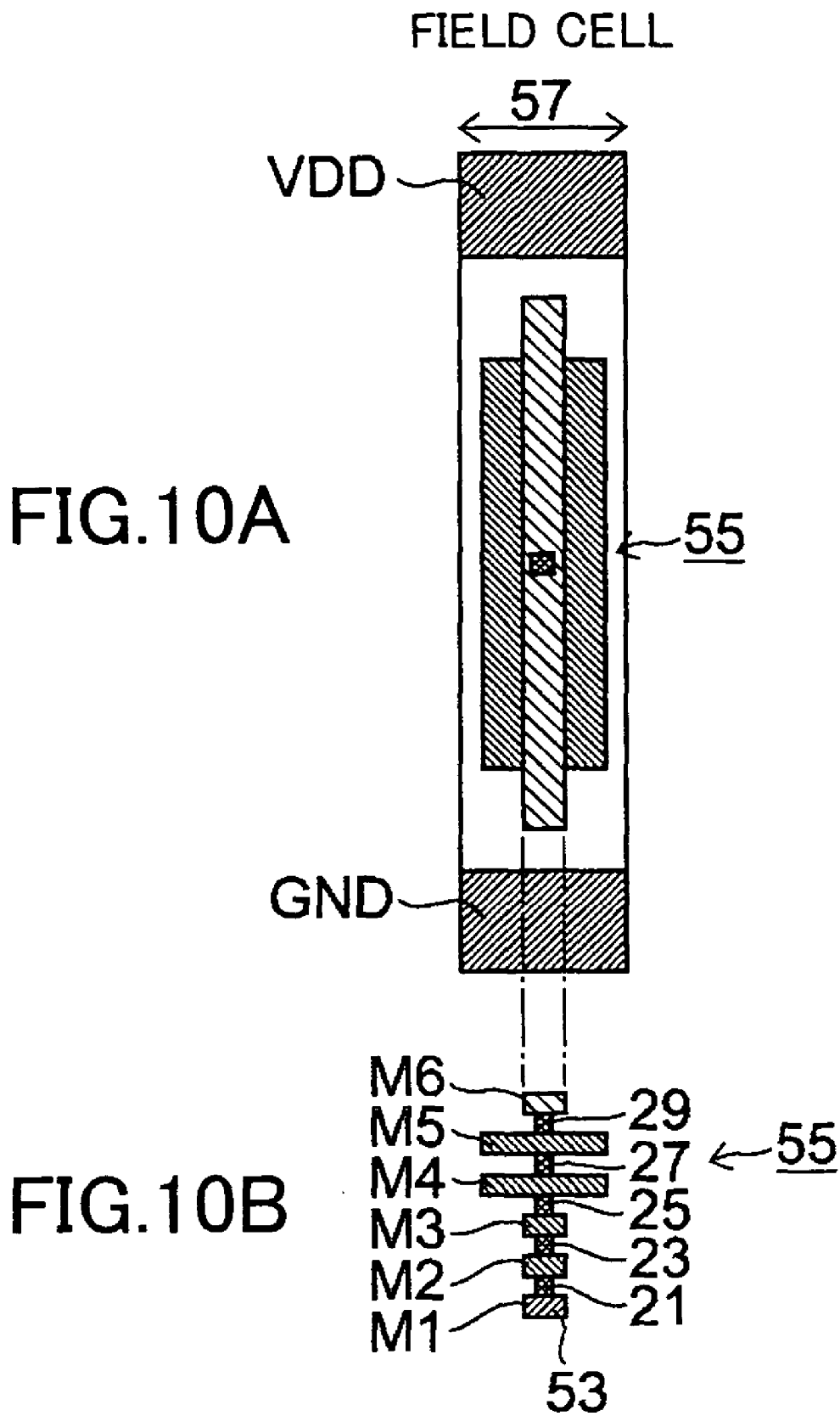
FIGS. 10A and 10B are diagrams illustrating a field cell having a heat conduction part according to another embodiment of the present invention.

At step S3, a field cell is arranged in an empty space between standard cells and wires in the determined wiring layout. In an ECO (Engineering Change Order) process, which is performed through layout modification for the purpose of improvement of timing trouble such as delay due to the wiring layout, the field cell is replaced with another field cell, for example, as illustrated in FIG. 6, FIG. 9 and FIG. 10, that includes a heat conduction part according to the present invention corresponding to heat capacity of a gate electrode in an arranged standard cell. Furthermore, at the same time, a standard cell is replaced with another standard cell, as the inverter B illustrated in FIG. 6A, that includes a heat conduction part according to the present invention corresponding to heat capacity of a gate electrode in the standard cell.

After the layout modification at step S4, a back-annotation process is performed at step S5. Namely, the capacity and resistance of a wire between cells is detected by means of software, and logic simulation is performed by using the detected capacity and resistance so as to improve accuracy.

If the back-annotation process gives a negative result (step S5: N), the control returns to the standard cell arrangement at step S1, the approximate and detail wiring arrangement at step S2 or the wiring modification at step S4. On the other hand, if the back-annotation process gives a satisfactory result (step S5: Y), the wiring layout is determined.

In this embodiment, a semiconductor integrated circuit device, which includes the heat conduction part, according to the present invention is fabricated in accordance with the above-mentioned fabrication method of a standard cell type semiconductor integrated circuit device. However, the fabrication method of the semiconductor integrated circuit device according to the present invention is not limited to the above-mentioned standard cell type fabrication method. The semiconductor integrated circuit device according to the present invention is applicable to a semiconductor integrated circuit device fabricated in accordance with any suitable fabrication method, sa will be appreciated by those skilled in the art.

The present invention is not limited to the specifically disclosed embodiments, and variations and modifications may be made without departing from the scope of the present invention.

The present application is based on Japanese priority application No. 2002-232551 filed Aug. 9, 2002, the entire contents of which are hereby incorporated by reference.

What is claimed is:

1. A semiconductor integrated circuit device, comprising:
a semiconductor element being formed on a support substrate;
a signal transmission part formed in a gate electrode of the semiconductor element comprising:
a plurality of metal wiring layers spaced apart from each other and arranged in a vertical stack, and a plurality of metal via layers connected to the metal wiring layers and coupling the metal wiring layers with each other; and
a heat conduction part formed in an insulation film on the support substrate comprising:
a plurality of metal wiring layers spaced apart from each other and arranged in a vertical stack, and
a plurality of metal via layers connected to the metal wiring layers and coupling the metal wiring layers with each other,
wherein the heat conduction part provides a path different from a signal transmission path provided by the signal transmission part.

2. The semiconductor integrated circuit device as claimed in claim 1, wherein the support substrate comprises one of a semiconductor substrate and a SOI substrate.

3. The semiconductor integrated circuit device as claimed in claim 1, wherein the heat conduction part comprises an uppermost wiring layer.

4. The semiconductor integrated circuit device as claimed in claim 3, further comprising an aperture in the insulation film exposing the uppermost wiring layer.

5. The semiconductor integrated circuit device as claimed in claim 1, wherein the semiconductor element comprises a MOS transistor and said MOS transistor comprises one of a fully-depletion type SOI transistor, a partially-depletion type SOI transistor and a SON transistor.

6. The semiconductor integrated circuit device as claimed in claim 5, further comprising an element separation film arranged to electrically separate the MOS transistor, and wherein the heat conduction part is directly connected to the element separation film.

7. The semiconductor integrated circuit device as claimed in claim 1, wherein the heat conduction part comprises at least one dummy metal that is not connected to an element of the semiconductor integrated circuit device that is capable of conducting a signal transmission.

8. A semiconductor integrated circuit device, comprising:
a plurality of semiconductor elements being formed on a support substrate;
a signal transmission part formed in a gate electrode of a semiconductor element comprising:
a plurality of metal wiring layers spaced apart from each other and arranged in a vertical stack, and a plurality of metal via layers connected to the metal wiring layers and coupling the metal wiring layers with each other;
a plurality of function modules being formed by modularizing the plurality of semiconductor elements for each function thereof; and
at least one heat conduction part comprising:
a plurality of metal wiring layers spaced apart from each other and arranged in a vertical stack, and
a plurality of metal via layers connected to the metal wiring layers and coupling the metal wiring layers with each other,
wherein the heat conduction part is formed in an insulation film to provide a path different from a signal transmission path provided by the signal transmission part, and wherein at least one of the plurality of function modules comprises one or more of the at least one heat conduction part.

9. The semiconductor integrated circuit device as claimed in claim 8, wherein the heat conduction part is arranged corresponding to heat capacity of a gate electrode of each of the plurality of function modules.

10. The semiconductor integrated circuit device as claimed in claim 8, further comprising:
at least one field cell being disposed in an empty space between the function modules, and
wherein one or more of the at least one field cell comprises one or more of the at least one heat conduction part.

11. The semiconductor integrated circuit device as claimed in claim 10, wherein the field cell having the heat conduction part is disposed corresponding to heat capacity of a gate electrode in a function module.

12. A semiconductor integrated circuit device comprising:
at least two inverter cells, the inverter cells further comprising:
source regions or drain regions formed in activation regions, the source or drain regions being surrounded by element separation films on a support substrate, and the element separation films being oxide films;
gate electrodes formed between the source regions or the drain regions on the support substrate;
input lines and output lines, the input lines being connected to the gate electrodes of the corresponding inverter cells, and the output lines being connected to source or drain regions of the corresponding inverter cells; and
a plurality of heat conduction parts, at least one of the plurality of heat conduction parts being directly connected to a respective element separation film on the support substrate of one of the inverter cells and the heat conduction part comprising:
a plurality of metal wiring layers spaced apart from each other and arranged in a vertical stack, and a plurality of metal via layers connected to the metal wiring layers and coupling the metal wiring layers with each other.

13. The semiconductor integrated device of claim 12, wherein another of the plurality of the heat conduction parts is directly connected to a gate electrode of the corresponding inverter cell.

14. The semiconductor integrated device of claim 12, wherein another of the plurality of the head conduction parts is directly connected to a source region of the corresponding inverter cell.

15. The semiconductor integrated circuit device of claim 12, further comprising at least one field cell being arranged in an empty space between the inverter cells, the field cell comprising a heat conduction part.

16. The semiconductor integrated circuit device of claim 12, further comprising a power supply line (VDD) and a ground line (GND), the power supply and ground lines being connected to source or drain regions different from that connected to the input and output lines.

17. The semiconductor integrated circuit device of claim 12, wherein the gate electrodes are formed of polysilicon films.

* * * * *